United States Patent
Zhidkov et al.

(10) Patent No.: US 8,331,519 B2
(45) Date of Patent: Dec. 11, 2012

(54) FREQUENCY DETECTOR AND PHASE LOCKED LOOP HAVING THE SAME

(75) Inventors: Sergey Zhidkov, Suwon-si (KR); Jun Ho Huh, Yongin-si (KR); Ki Seop Kwon, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 898 days.

(21) Appl. No.: 12/430,691

(22) Filed: Apr. 27, 2009

(65) Prior Publication Data

US 2009/0310730 A1    Dec. 17, 2009

(30) Foreign Application Priority Data

Jun. 11, 2008   (KR) ........................ 10-2008-0054626

(51) Int. Cl.
*H04L 7/00* (2006.01)
(52) U.S. Cl. ........ 375/376; 375/316; 375/354; 375/355; 375/357; 375/359; 375/360; 375/368; 375/371; 375/373; 375/375; 327/48; 327/156; 327/161
(58) Field of Classification Search ............... 375/316, 375/376, 354, 355, 357, 359, 360, 368, 371, 375/373, 375; 327/48, 156, 161
See application file for complete search history.

(56) References Cited

U.S. PATENT DOCUMENTS

| | | | |
|---|---|---|---|
| 6,792,063 B1 * | 9/2004 | Ogura | 375/375 |
| 7,423,948 B2 * | 9/2008 | Kawabe et al. | 369/53.34 |
| 2003/0189505 A1 * | 10/2003 | Okamoto | 341/144 |
| 2004/0178936 A1 * | 9/2004 | Lee et al. | 341/120 |
| 2004/0227548 A1 * | 11/2004 | Park et al. | 327/113 |
| 2006/0153041 A1 * | 7/2006 | Miyashita et al. | 369/59.22 |
| 2007/0047690 A1 * | 3/2007 | Zhao et al. | 375/376 |
| 2009/0060451 A1 * | 3/2009 | Mouri et al. | 386/85 |

FOREIGN PATENT DOCUMENTS

| | | |
|---|---|---|
| JP | 2000-022526 | 1/2000 |
| JP | 2005-293812 | 10/2005 |
| JP | 2006-155824 | 6/2006 |
| KR | 1020030006017 | 1/2003 |

OTHER PUBLICATIONS

English Abstract for Publication No. 2000-022526.
English Abstract for Publication No. 1020030006017.
English Abstract for Publication No. 2005-293812.
English Abstract for Publication No. 2006-155824.

* cited by examiner

*Primary Examiner* — Siu Lee
(74) *Attorney, Agent, or Firm* — F. Chau & Associates, LLC

(57) ABSTRACT

A frequency detector includes an error measurement unit measuring a time interval between zero-crossing points of an input signal that is modulated. An error conversion unit quantizes the measured time interval using one of modulation time intervals. An error calculation unit calculates a frequency error based upon a difference between the measured time interval and the quantized time interval. An error generation control unit controls whether to output the frequency error based upon the quantized time interval, the calculated frequency error, and a predetermined critical value.

20 Claims, 12 Drawing Sheets

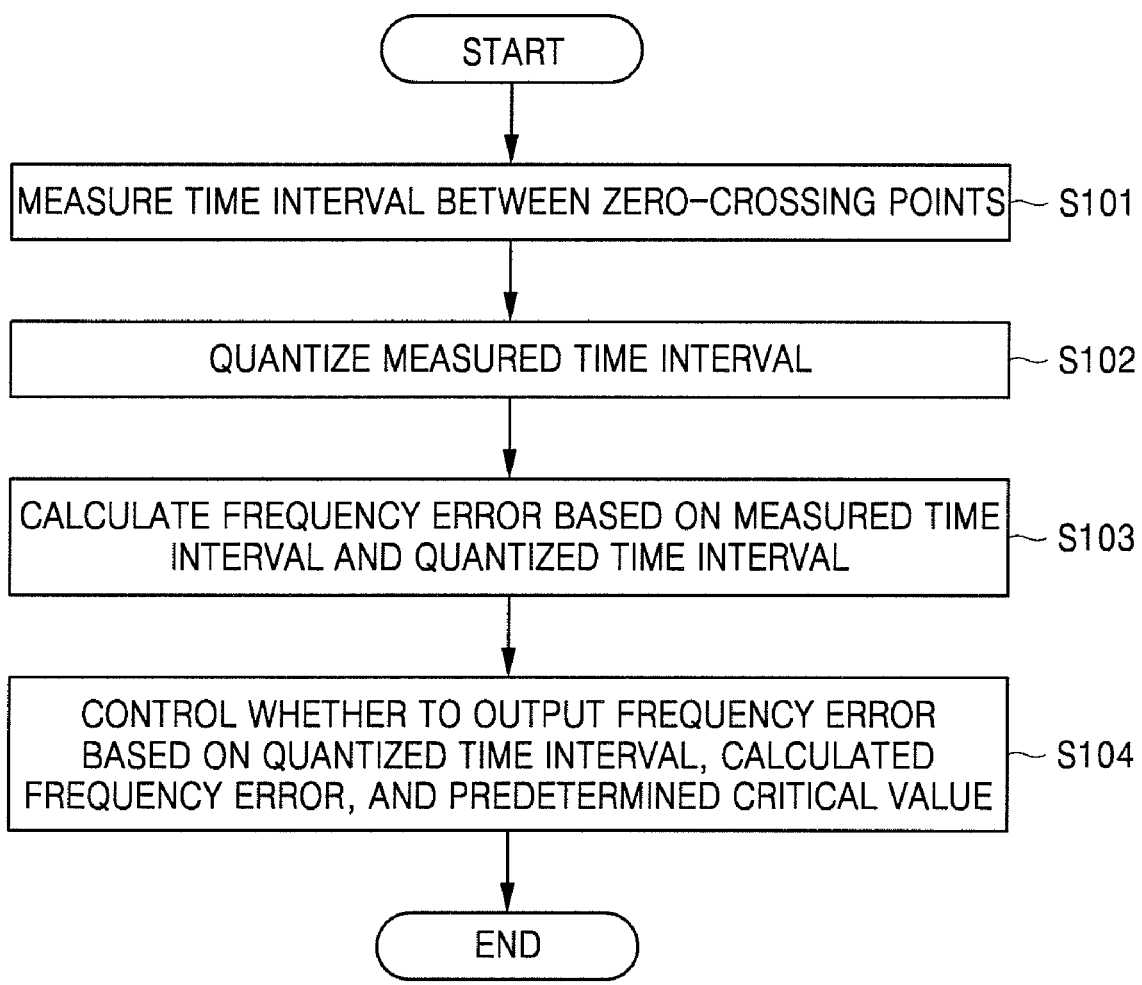

FREQUENCY DETECTOR AND PHASE LOCKED LOOP HAVING THE SAME

CROSS-REFERENCE TO RELATED APPLICATION

This application claims priority to and the benefit of Korean Patent Application No. 10-2008-0054626, filed on Jun. 11, 2008, in the Korean Intellectual Property Office, the entire content of which is incorporated herein by reference.

BACKGROUND

1. Field of the Invention

The present invention relates to a frequency detector and a phase locked loop (PLL), and, more particularly, to a frequency detector capable of continuously detecting a frequency error and a PLL capable of performing time sync using the frequency detector.

2. Description of the Related Art

Typically, electronic devices use a PLL to vary the frequency of a received data signal to a frequency at which the electronic devices operate and constantly maintain the frequency. The PLL performs frequency sync and time sync with respect to the received data signal.

SUMMARY

In accordance with exemplary embodiments of the present invention a frequency detector and a PLL are provided for performing time sync to a wide frequency error range after performing frequency sync.

According to an exemplary embodiment of the present invention, there is provided a frequency detector including an error measurement unit, an error conversion unit, an error calculation unit, and an error generation control unit.

The error measurement unit measures a time interval between zero-crossing points of an input signal that is modulated, in a linear interpolation method. The error conversion unit quantizes the measured time interval using one of modulation time intervals. The error calculation unit calculates a frequency error based upon a difference between the measured time interval and the quantized time interval. The error generation control unit controls whether to output the frequency error based upon the quantized time interval, the calculated frequency error, and a predetermined critical value.

The error measurement unit may include a sampling unit, a first linear interpolation unit, a zero-crossing point detection unit, and a second linear interpolation unit. The sampling unit may generate a first absolute value and a second absolute value respectively corresponding to the input signal and a delayed input signal at the sampling time points before and after the j-th zero-crossing point, where "j" is a natural number over 2. The first linear interpolation unit may generate a first interpolation value based upon the first and second absolute values.

The zero-crossing point detection unit may detect a zero-crossing point of each of the input signal and the delayed input signal and measure the number of samplings between the j-th zero-crossing point and i-th zero-crossing point, where "i" is a natural number over 2. The second linear interpolation unit may generate an interpolation value difference based upon the first interpolation value and a second interpolation value generated at the i-th zero-crossing point and, and generate the measured time interval based upon the measured sampling number and the interpolation value difference.

The sampling unit may include a delay unit receiving the input signal, delaying the received input signal for a predetermined time, and outputting the delayed input signal, and an absolute value generation unit generating the first and second absolute values based upon values obtained by sampling the input signal and the delayed input signal at a predetermined time interval.

The first linear interpolation unit may include a first adder receiving the first and second absolute values, summing the received first and second absolute values and outputting a third absolute value, a look-up table receiving the third absolute value and generating a reciprocal of the received third absolute value, and a first multiplier receiving the second absolute value and the reciprocal of the third absolute value and generating the first interpolation value by multiplying the second absolute value and the reciprocal of the third absolute value.

The zero-crossing point detection unit may include a zero-crossing point detector detecting a zero-crossing point of each of the input signal and the delayed input signal and a counter generating the measured sampling number by counting the number of samplings from the j-th zero-crossing point generation point in time to the i-th zero-crossing point generation point in time.

The second linear interpolation unit may include a register, a second adder, and a third adder. The register may receive and store the first interpolation value in response to the generation of the j-th zero-crossing point, and output the stored second interpolation value. The second adder receives the first and second interpolation values and generate the interpolation value difference based upon the first and second interpolation values. The third adder receives the interpolation value difference and the measured sampling number, sums the interpolation value difference and the measured sampling number, and generates the measured time interval.

The error measurement unit may further include a first selector that selectively outputs the measured time interval at a positive zero-crossing point or the measured time interval at a negative zero-crossing point. The error conversion unit may quantize the measured time interval using the closest time interval of the modulation time intervals.

The error generation control unit may include a first error generation control unit, a second error generation control unit, and an error generation determination unit. The first error generation control unit may generate a first control signal based upon whether the quantized time interval is within a predetermined time interval range. The second error generation control unit may generate a second control signal based upon a result of comparison between the calculated frequency error and the predetermined critical value. The error generation determination unit may control whether to output the frequency error in response to the first control signal and the second control signal.

The error generation control unit may further include a sign detection unit that receives the frequency error and outputs only a sign value indicating the direction of the frequency error to the error generation determination unit.

The frequency detector may further include an amplification unit that multiplies the frequency error output from the error generation control unit by a predetermined gain value and outputs a multiplied frequency error.

According to another exemplary embodiment of the present invention, there is provided a phase locked loop including a first frequency detector, a second frequency detector, a phase detector, and a loop filter. The first frequency detector detects and outputs a first frequency error based upon a sync pulse of an input signal that is modulated in a first operational mode from a point in time when a supply of power starts to a point in time when a frequency of the input signal approaches a first frequency. The second frequency detector detects and outputs a second frequency error based upon a data pulse of the input signal in a second operational mode from the point in time when the frequency of the input signal approaches the first frequency to a point in time when the frequency of the input signal approaches a second frequency.

The phase detector detects and outputs a third frequency error in the second operational mode and in a third operational mode from the point in time when the frequency of the input signal approaches the second frequency to a point in time when the frequency of the input signal approaches a locking frequency. The loop filter generates an accumulated frequency error in proportion to one of the first, second, and third frequency errors that is received based upon the operational mode, wherein a locking operation with respect to the data signal is performed based upon the accumulated frequency error.

The second frequency may be a frequency that the phase locked loop can track the frequency of the data signal to the locking frequency based upon the accumulated frequency error. The phase locked loop may further include a frequency error selection unit that selectively outputs a corresponding one of the first, second, and third frequency errors based upon the operational mode, to the loop filter.

The second frequency detector may further include an error measurement unit, an error conversion unit, an error calculation unit, and an error generation control unit. The error measurement unit may measure a time interval between zero-crossing points of the input signal. The error conversion unit may quantize the measured time interval using one of modulation time intervals. The error calculation unit may calculate a frequency error based upon a difference between the measured time interval and the quantized time interval. The error generation control unit may control whether to output the second frequency error based upon the quantized time interval, the calculated frequency error, and a predetermined critical value.

The loop filter may include a first filter, a second filter, and a first adder. The first filter may output a fourth frequency error in proportion to the third frequency error. The second filter may receive a corresponding one of the first, second, and third frequency errors based upon the operational mode and output a fifth frequency error accumulated in proportion to the received frequency error. The first adder may generate the accumulated frequency error by receiving and summing the fourth and fifth frequency errors.

The first adder may receive and sum the fourth frequency error and the fifth frequency error and generate the accumulated frequency error. The second filter may include a second adder and a delay unit. The second adder may receive and sum the received frequency error and a delayed fifth frequency error to generate the fifth frequency error. The delay unit receives the fifth frequency error, delays the received fifth frequency error for a predetermined time, and outputs the delayed fifth frequency error.

BRIEF DESCRIPTION OF THE DRAWINGS

FIG. 9 is a flowchart showing the operation of a frequency detector according to an exemplary embodiment of the present invention.

DETAILED DESCRIPTION OF THE EMBODIMENTS

Figure 1:
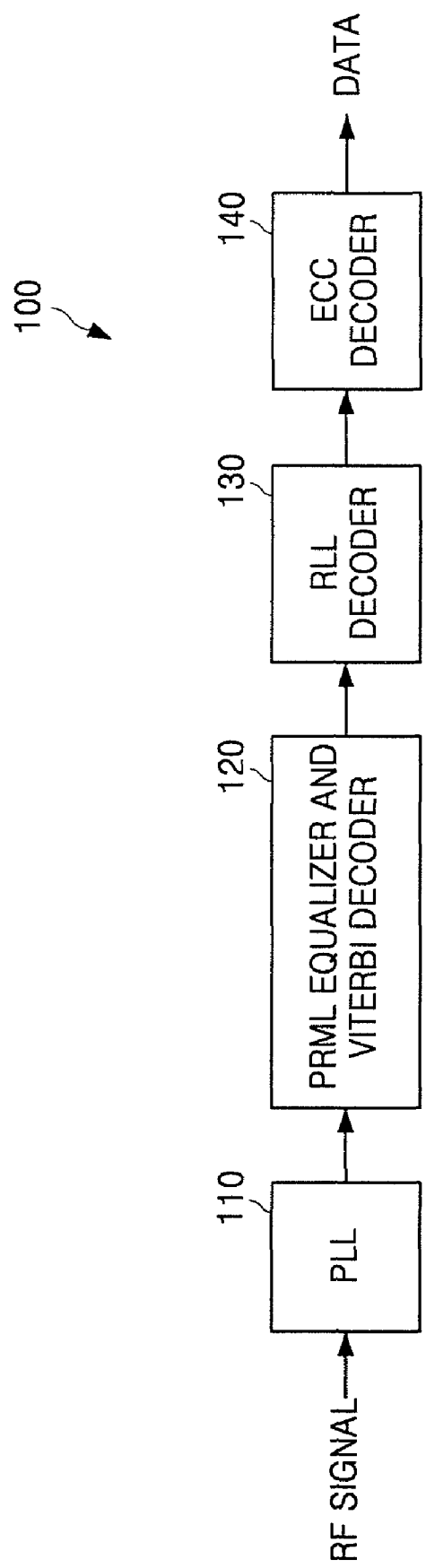
FIG. 1 is a block diagram showing the signal processing device of a typical digital versatile disc/digital video disc (DVD) read channel.

First, the operation of frequency sync and time sync will be discussed with reference to, for example, a DVD. Referring to FIG. 1, the DVD read channel includes a PLL 110, a partial response maximum likelihood (PRML) equalizer and Viterbi decoder 120, a run length limited (RLL) decoder 130, and an error correction coding (ECC) decoder 140. The PLL 100 varies the frequency of a received RF signal to a signal having a particular frequency and performs frequency sync and time sync with respect to the signal having a particular frequency. The RF signal is a signal modulated to an improved version of eight-to-fourteen modulation format (EFM+) that is a DVD format. Then, the signal output from the PLL 110 passes through the PRML equalizer and Viterbi decoder 120, the RLL decoder 130, and the ECC decoder 140 and then is restored to a data signal.

In the frequency sync operation and the time sync operation of the PLL 110, first, the PLL 110 performs frequency sync using a frequency detector (not shown). The frequency sync is performed using a characteristic of a sync pulse included in a payload signal.

The sustain time of a sync pulse in a DVD format is 14T, where "T" is a clock cycle, which is longer than the sustain time of a data pulse that is 3T-11T. The PLL 110 performs frequency sync within a predetermined range, for example, ±20%, from a target frequency using a frequency error output from the frequency detector, using the characteristic of the DVD format. Next, after performing the frequency sync, the PLL 110 performs time sync to correct a frequency error using a phase detector (not shown).

The PLL 110 performs a relatively precise locking operation when a frequency error range after the frequency sync is performed is within a predetermined range or when a change in the frequency error is slow. However, the PLL 110 does not perform a precise locking operation when the frequency error range after the frequency sync is performed is out of the predetermined range or when a change in the frequency error is fast.

Figure 2:
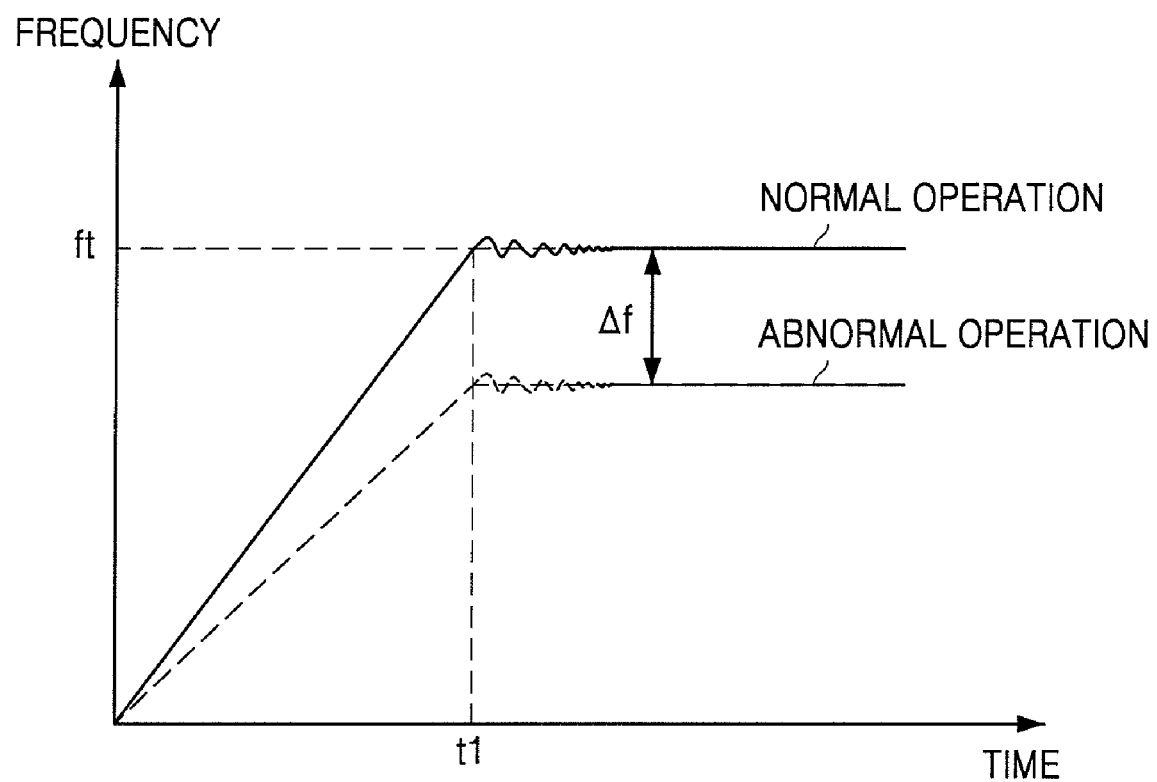
FIG. 2 is a graph showing the frequency of an output signal of a typical PLL according to the operational status.

FIG. 2 is a graph showing the frequency of an output signal of the PLL 110 according to the operational status. The frequency of an output signal of the PLL 110 during a normal operation converges into a target frequency ft. However, it can be seen that, when a frequency error Δf at a time t1 after the frequency sync is performed is high, the frequency of an output signal of the PLL 110 fails to reach the target frequency ft.

The malfunction of the PLL 110 may cause a DVD disc error, a recorder error, for example, a DVD writer error, an error in the servomechanism of a DVD drive, or loss of information. To address these problems, a gain value of a loop filter (not shown) of the PLL 110 may be increased, but such causes jitter of a data signal.

Figure 3:
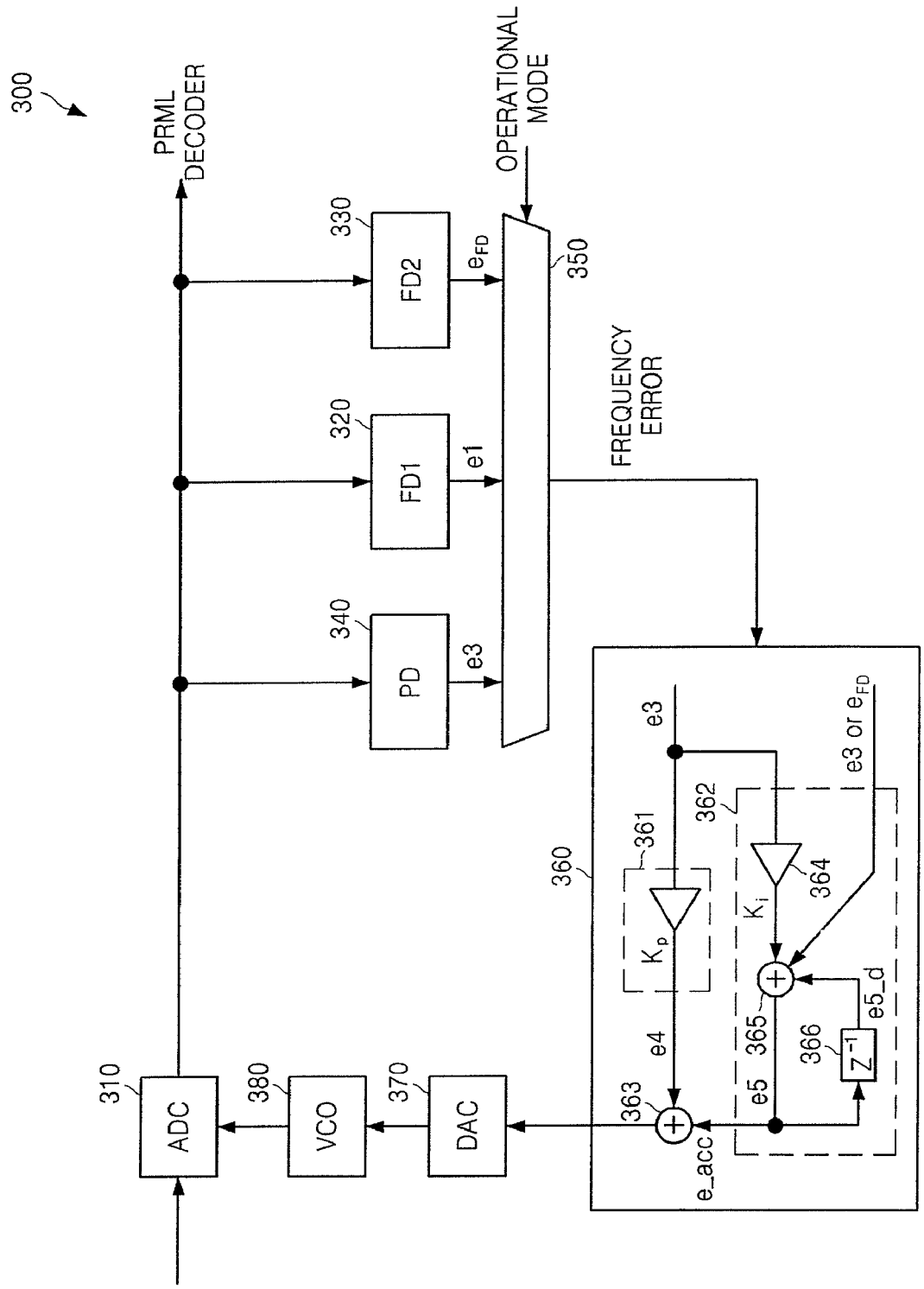
FIG. 3 is a block diagram showing a PLL according to an exemplary embodiment of the present invention.

FIG. 3 is a block diagram showing a PLL 300 according to an exemplary embodiment of the present invention. The PLL 300 includes an analog-to-digital converter (ADC) 310, a first frequency detector (FD1) 320, a second frequency detector (FD2) 330, a phase detector (PD) 340, a frequency error selection unit 350, a loop filter 360, a digital-to-analog converter (DAC) 370, and a voltage control oscillator 380.

The ADC 310 receives an RF signal modulated in a particular manner, for example, EFM+, and converts the received RF signal to a digital signal and outputs a converted digital signal. Each of the FD1 320, the FD2 330, and the PD 340 detects and outputs a frequency error of the digital signal based upon the operational mode of the PLL 300.

The operational mode of the PLL 300 includes a first operational mode, a second operational mode, and a third operational mode. The first operational mode is from a point in time when a supply of power starts to a point in time when the frequency of a digital signal approaches a first frequency. The second operational mode is from the point in time when the frequency of a digital signal approaches the first frequency to a point in time when the frequency of a digital signal approaches a second frequency. The third operational mode is from the point in time when the frequency of a digital signal approaches the second frequency to a point in time when the frequency of a digital signal approaches a locking frequency.

The first frequency is a frequency for designating a point in time when the operation of the FD1 320 is completed. The second frequency is a frequency at which the PLL 300 tracks the frequency of the digital signal to the locking frequency, that is, the target frequency, based upon an accumulated frequency error output from the loop filter 360.

The FD1 320 detects and outputs a first frequency error e1 in the first operational mode. The FD2 330 detects and outputs a second frequency error $e_{FD}$ using a linear interpolation method. The PD 340 detects and outputs a third frequency error e3 in the second and third modes.

The frequency error selection unit 350 selectively outputs a corresponding frequency error of the first, second, and third frequency errors e1, $e_{FD}$, and e3, to the loop filter 360, based upon the operational mode. In FIG. 3, although the output from the frequency error selection unit 350 is indicated merely as a frequency error, the frequency error may be any one of the first, second, and third frequency errors e1, $e_{FD}$, and e3 according to the operational mode.

Figure 4:
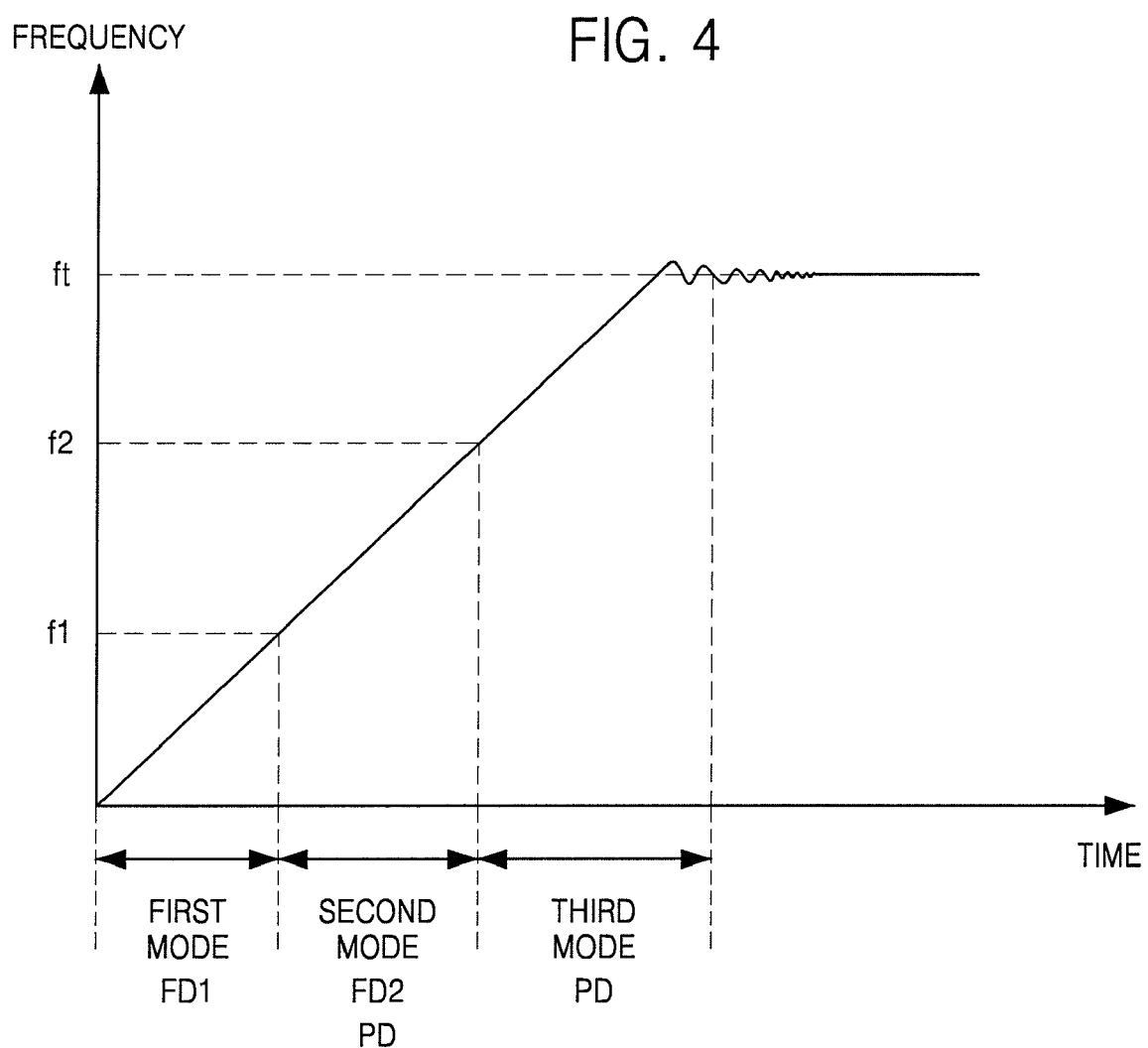
FIG. 4 is a graph for explaining the process of a locking operation according to the operational mode of the PLL of FIG. 3.

FIG. 4 is a graph for explaining the process of a locking operation according to the operational mode of the PLL 300 of FIG. 3. In the first operational mode, the PLL 300 performs frequency sync to increase the frequency of the digital signal to a first frequency f1 in a predetermined range, for example, ±20%, from a target frequency ft, using the first frequency error e1 output from the FD1 320.

For example, in the first operational mode in which the PLL 300 is initially driven, the FD1 320 performs frequency sync using the first frequency error e1 generated based upon a pulse (the sustain time of a sync pulse) of 14T that is the longest sustain time of an EFM+ signal, where "T" is a clock cycle.

In the second operational mode, the PLL 300 performs frequency sync to increase the frequency of the digital signal to the second frequency f2 using the second frequency error $e_{FD}$ output from the FD2 330. For example, in the second mode, the FD2 330 continuously generates the second frequency error $e_{FD}$ using a data pulse (having the sustain time of 3T-11T) of the EFM+ signal, and the PLL 300 performs frequency sync. In the third operational mode, the PLL 300 performs time sync based upon the third frequency error e3 output from the PD 340.

In comparison with the PLL according to an exemplary embodiment of the present invention, the typical PLL indirectly performs time sync based upon the accumulated frequency error or a phase difference using a phase detector after performing frequency sync using a frequency detector. However, in the PLL 300 frequency sync is further performed as the FD2 330 detects a frequency error directly from a modulated signal after the frequency sync is performed using the FD1 320. Thus, as compared to the typical PLL, the PLL 300 according to the exemplary embodiment of present invention expands the frequency tracking range based upon the additional sync performance by the FD2 330.

Figure 5:
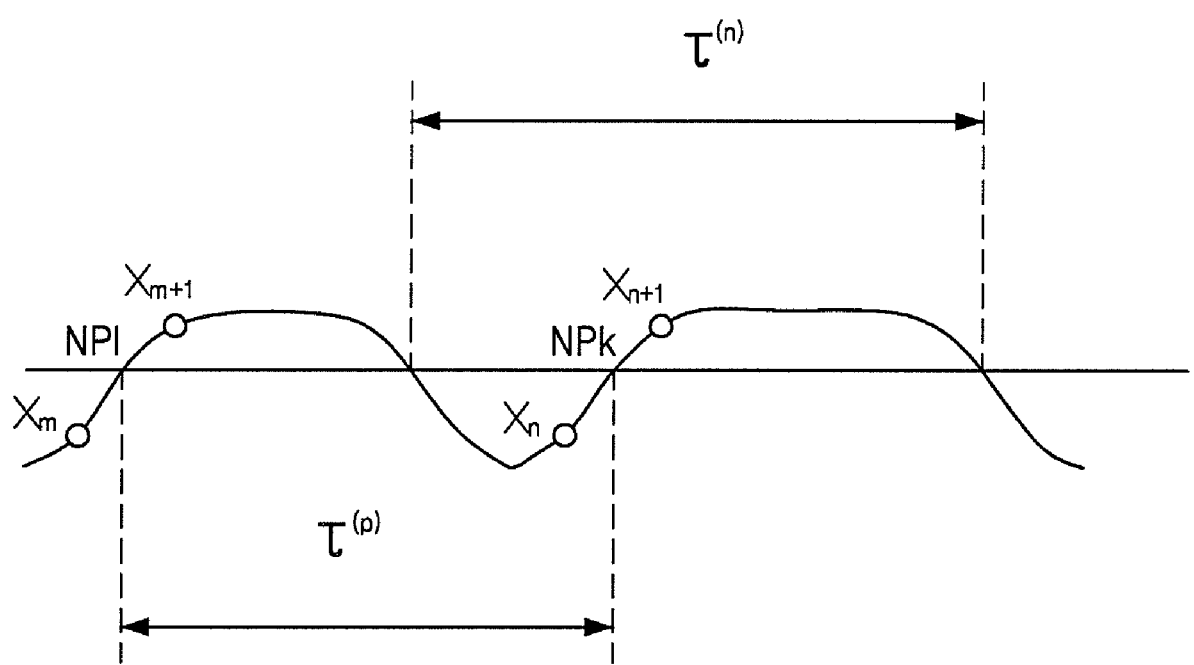
FIG. 5 is a graph for explaining a linear interpolation method performed by a second frequency detector of FIG. 3.

FIG. 5 is a graph for explaining the linear interpolation method performed by the FD2 330 of FIG. 3. In the linear interpolation method, the direction of a frequency error calculated based upon an assumption that the sampling values before and after a zero-crossing point be connected by a straight line, is traced. For example, when a sampling frequency of a signal is higher than a data rate of an actual signal, the frequency error may be a positive direction. As shown in FIG. 5, whenever a zero-crossing point is generated, the FD2 330 detects a frequency error so that a continuous frequency detection is performed.

However, in a system using the PLL 300 according to an exemplary embodiment of the present invention, for example, a DVD system, a data signal may have an asymmetrical characteristic due to distortion during a transmission process or an abnormal characteristic of a medium, for example, a DVD disc. That is, a positive pulse and a negative pulse of the data signal may be shortened or lengthened according to the system. Referring to FIG. 5, to address this problem, the FD2 330 separately measures a time interval between the zero-crossing points by dividing the zero-crossing points into positive zero-crossing points and negative zero-crossing points.

A second frequency error $e_{FD}$ output from the FD2 330 can be expressed by Equation 1.

$$e_{FD} = \begin{cases} K_{FD}(\tau - \hat{\tau}), & \text{if } (|\tau - \hat{\tau}| < \varepsilon) \text{ and } T_{min} \leq \hat{\tau} \leq T_{max} \\ 0, & \text{otherwise} \end{cases} \quad \text{[Equation 1]}$$

In Equation 1, "$K_{FD}$" is a gain value of the FD2 330, "$\tau$" is the measured time interval between the zero-crossing points, "$\hat{\tau}$" is the time interval between the quantized zero-crossing points, "$\varepsilon$" is a critical value of the second frequency error $e_{FD}$, "$T_{min}$" is the minimum value of the quantized time interval "$\hat{\tau}$", and "$T_{max}$" is the maximum value of the quantized time interval "$\hat{\tau}$".

For example, for the EFM+ signal, "$T_{min}$" is set to 6T and "$T_{max}$" is set to 12T-15T. Referring to Equation 1, it can be seen that the second frequency error $e_{FD}$ is generated only when the difference between the measured time interval "$\tau$" and the quantized time interval "$\hat{\tau}$" is smaller than the critical value "$\epsilon$" of the second frequency error $e_{FD}$ and the quantized time interval "$\hat{\tau}$" is within in a range between "$T_{min}$" and "$T_{max}$".

The measured time interval "$\tau$" is divided into a time interval $\tau^p$ between the positive zero-crossing points and a time interval $\tau^n$ between the negative zero-crossing points. Referring to FIG. 5, the time interval $\tau^p$ between the positive zero-crossing points can be expressed by Equation 2.

$$\tau^p \approx k^p + t_2^p - t_1^p = k^p + \frac{|x_n|}{|x_n| + |x_{n+1}|} - \frac{|x_m|}{|x_m| + |x_{m+1}|} \quad \text{[Equation 2]}$$

In Equation 2, "$k^p$" is the sampling number between the j-th zero-crossing point NP1, where "j" is a natural number over 2, and the i-th zero-crossing point NPk, where "i" is a natural number over 2, "$t_2^p$" is an interpolation value at the j-th zero-crossing point NP1, "$t_1^p$" is an interpolation value at the i-th zero-crossing point NPk, "$x_n$" and "$x_{n+1}$" denote values of signals sampled before and after the j-th zero-crossing point NP1, and "$x_m$" and "$x_{m+1}$" denote values of signals sampled before and after the i-th zero-crossing point NPk. The time interval $\tau^n$ between the negative zero-crossing points may be obtained by replacing "p" in Equation 2 with "n".

Figure 6:
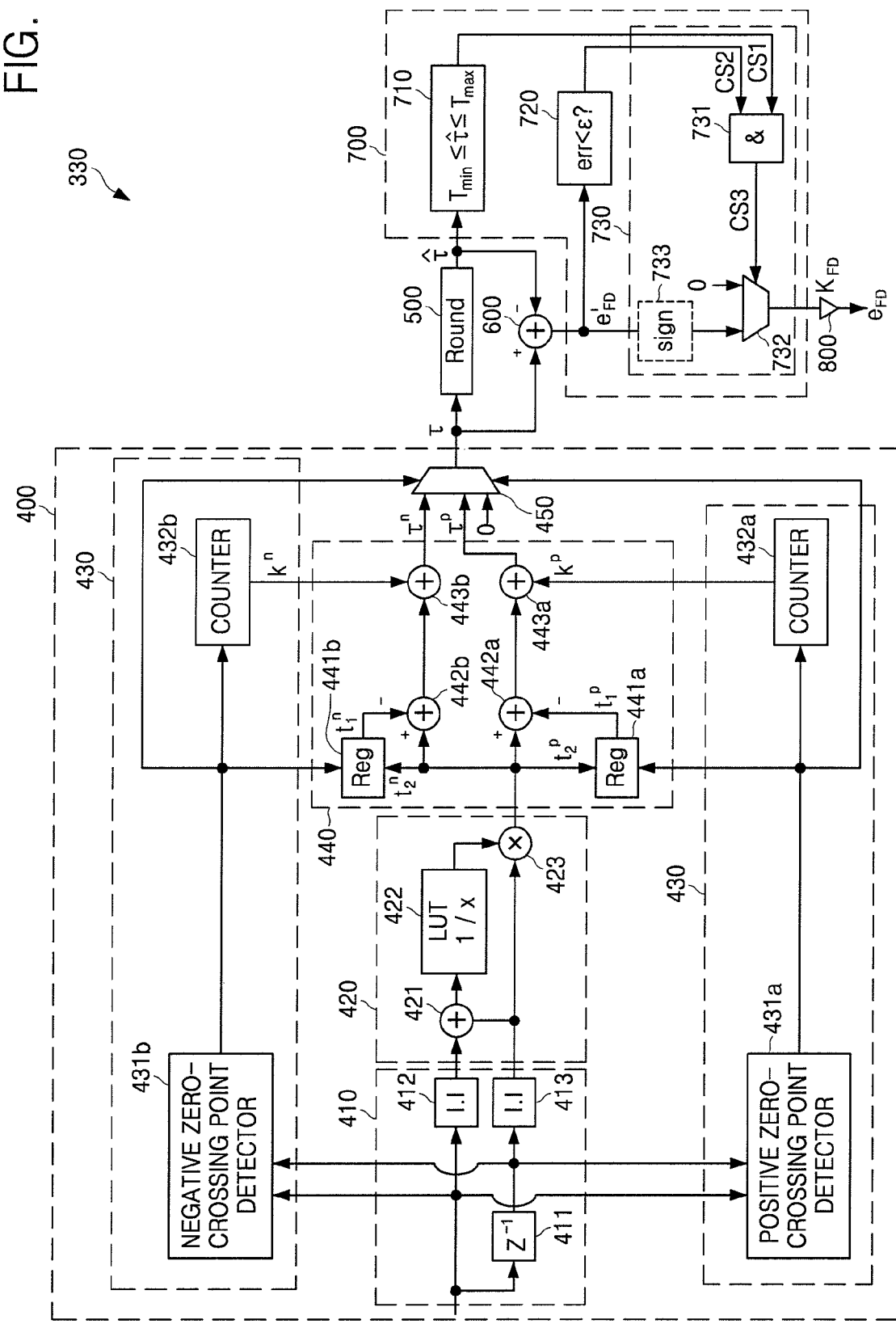
FIG. 6 is a block diagram showing the second frequency detector of FIG. 3.

FIG. 6 is a block diagram showing the FD2 330 of FIG. 3. Referring to FIG. 6, the FD2 330 includes an error measurement unit 400, an error conversion unit 500, an error calculation unit 600, and an error generation control unit 700. The error measurement unit 400 measures the time interval $\tau$ between the zero-crossing points of an input signal modulated in a linear interpolation method. The error measurement unit 400 includes a sampling unit 410, a first linear interpolation unit 420, a zero-crossing point detection unit 430, a second linear interpolation unit 440, and a first selector 450.

The sampling unit 410 generates a first absolute value and a second absolute value respectively corresponding to the input signal and a delayed input signal at sampling point in time before and after the l-th zero-crossing point where "l" is a nature number over 2. The sampling unit 410 includes a first delay unit 411 and absolute value generation units 412, 413.

The first delay unit 411 receives the input signal and delays the received input signal for a predetermined time, and outputs the delayed input signal. The absolute value generation units 412, 413 respectively generate the first and second absolute values based upon a value obtained by sampling the input signal and the delayed input signal at a preset time interval.

The first linear interpolation unit 420 generates a first interpolation value $t_2^p$ or $t_2^n$ based upon the first and second absolute values. The first linear interpolation unit 420 includes a first adder 421, a look-up table 422, and a first multiplier 423.

The first adder 421 receives the first and second absolute values, add the received two absolute values, and output a third absolute value. The look-up table 422 receives the third absolute value and generates a reciprocal of the received third absolute value. For example, when the resolution of ADC 310 is 6 bits, the look-up table 422 has 64 entries. However, to remove complexity in the implementation of hardware, the number of entries of the look-up table 422 may be reduced. The first multiplier 423 receives and multiplies the second absolute value and the reciprocal of the third absolute value and generates the first interpolation value $t_2^p$ or $t_2^n$.

The zero-crossing point detection unit 430 detects the zero-crossing point of each of the input signal and the delayed input signal and measures the number of samplings $k^p$ or $k^n$ between the j-th zero-crossing point and the i-th zero-crossing point. The zero-crossing point detection unit 430 includes zero-crossing point detectors 431a, 431b and counters 432a, 432b. The zero-crossing point detection unit 430 detects a zero-crossing point of each of the input signal and the delayed input signal and includes a detector 431a for detecting a positive zero-crossing point and a detector 431b for detecting a negative zero-crossing point.

The counters 432a, 432b count the number of samplings from a point in time when the j-th zero-crossing point is generated to a point in time when the i-th zero-crossing point is generated and generate the measured sampling number $k^p$ or $k^n$. The counters 432a, 432b are a counter 432a for a positive zero-crossing point and a counter 432b for a negative zero-crossing point.

The second linear interpolation unit 440 generates an interpolation value difference $t_2^p - t_1^p$ or $t_2^n - t_1^n$ based upon the first interpolation value $t_2^p$ or $t_2^n$ and the second interpolation value $t_1^p$ or $t_1^n$ generated at the i-th zero-crossing point, and generates the measured time interval $t_1^p$ or $t_1^n$ based upon the measured sampling number $k^p$ or $k^n$ and the interpolation value difference $t_2^p - t_1^p$ or $t_2^n - t_1$. The second linear interpolation unit 440 includes registers 441a, 441b, second adders 442a, 442b, and third adders 443a, 443b.

The registers 441a, 441b receive and store the first interpolation value $t_2^p$ or $t_2^n$ in response to the generation of j-th zero-crossing point, output the stored second interpolation value $t_1^p$ or $t_1^n$. The registers 441a, 441b respectively correspond to the positive and negative zero-crossing points. The second adders 442a, 442b receive the first interpolation value $t_2^p$ or $t_2^n$ and the second interpolation value $t_1^p$ or $t_1^n$ and generate the interpolation value difference $t_2^p - t_1^p$ or $t_2^n - t_1^n$ based upon the first interpolation value $t_2^p$ or $t_2^n$ and the second interpolation value $t_1^p$ or $t_1^n$. The second adders 442a, 442b respectively correspond to the positive and negative zero-crossing points.

The third adders 443a, 443b receive the interpolation value difference $t_2^p - t_1^p$ or $t_2^n - t_1^n$ and the measured sampling number $k^p$ or $k^n$, add the interpolation value difference $t_2^p - t_1^p$ or $t_2^n - t_1^n$ and the measured sampling number $k^p$ or $k^n$, and generate the measured time interval $\tau^p$ or $\tau^n$. The third adders 443a, 443b respectively correspond to the positive and negative zero-crossing points.

The first selector 450 selectively outputs the measured time interval $\tau^p$ or $\tau^n$ in response to the generation of the j-th zero-crossing point. That is, the first selector 450 outputs the time interval $\tau^p$ between positive zero-crossing points when the positive zero-crossing points are generated and the time interval $\tau^n$ between negative zero-crossing points when the negative zero-crossing points are generated.

The error conversion unit 500 quantizes the measured time interval $\tau^p$ or $\tau^n$ by one of modulation time intervals, for example, the modulation time interval of EFM+. For example, the error conversion unit 500 may quantize the measured time interval $\tau^p$ or $\tau^n$ using the closest time interval of the modulation time intervals.

The error calculation unit 600 calculates a frequency error $e_{FD}'$ based upon a difference between the measured time interval $\tau^p$ or $\tau^n$ and the quantized time interval $\hat{\tau}^p$ or $\hat{\tau}^n$. The error calculation unit 600 includes a fourth adder that receives the measured time interval $\tau^p$ or $\tau^n$ and the quantized time interval $\hat{\tau}^p$ or $\hat{\tau}^n$ and generates frequency error $e_{FD}'$ based upon the difference between the measured time interval $\tau^p$ or $\tau^n$ and the quantized time interval $\hat{\tau}^p$ or $\hat{\tau}^n$.

The error generation control unit 700 controls whether to output the frequency error $e_{FD}{}'$ based upon the quantized time interval $\hat{\tau}^p$ or $\hat{\tau}^n$, the calculated frequency error $e_{FD}{}'$, and the predetermined critical value. The error generation control unit 700 includes a first error generation control unit 710, a second error generation control unit 720, and an error generation determination unit 730.

The first error generation control unit 710 generates a first control signal CS1 based upon whether the quantized time interval $\hat{\tau}^p$ or $\hat{\tau}^n$ is within a predetermined time interval range between Tmin and Tmax. The second error generation control unit 720 generates a second control signal CS2 based upon the result of a comparison between the calculated frequency error $e_{FD}{}'$ and a critical value $\epsilon$ of the calculated frequency error $e_{FD}{}'$.

The error generation determination unit 730 controls whether to output the frequency error $e_{FD}{}'$ in response to the first and second control signals CS1, CS2. The error generation determination unit 730 includes a third error generation control unit 731 and a second selector 732. The third error generation control unit 731 generates a frequency error generation control signal CS3 based upon the first and second control signals CS1, CS2.

The second selector 732 selectively outputs the frequency error $e_{FD}{}'$ in response to the frequency error generation control signal CS3. For example, the frequency error $e_{FD}{}'$ is output only when quantized time interval $\hat{\tau}^p$ or $\hat{\tau}^n$ is within the predetermined time interval range between Tmin and Tmax and the frequency error $e_{FD}{}'$ is smaller than the predetermined critical value $\epsilon$.

The error generation control unit 730 further includes a sign detection unit 733 that receives the frequency error $e_{FD}{}'$ and outputs only a sign value, for example, +1 or −1, indicating the direction of the frequency error $e_{FD}{}'$. The second frequency detector 330 further includes an amplification unit 800 that outputs the frequency error $e_{FD}$ obtained by multiplying the frequency error $e_{FD}{}'$ output from the error generation control unit 730 by a predetermined gain value $K_{FD}$. The second frequency error $e_{FD}$ expressed by Equation 1 is a frequency error output from the amplification unit 800.

Referring back to FIG. 3, the loop filter 360 receives the frequency error $e_{FD}$ output from the frequency error selection unit 350 and accumulatively outputs the received frequency error $e_{FD}$. The loop filter 360 includes a first filter 361, a second filter 362, and a fifth adder 363. The first filter 361 receives the third frequency error e3 based upon the operational mode and outputs a fourth frequency error e4 in proportion to the third frequency error e3. The first filter 361 is an amplification unit having a predetermined gain value Kp.

The second filter 362 receives a frequency error corresponding to one of the first, second, and third frequency errors e1, $e_{FD}$, e3, based upon the operational mode, and outputs a fifth frequency e5 error accumulated in proportion to the received frequency error. The fifth adder 363 generates an accumulative frequency error e_acc by receiving and adding the fourth and fifth frequency errors e4, e5.

The second filter 362 includes a sixth adder 365 and a second delay unit 366. The sixth adder 365 generates the fifth frequency error e5 by receiving and adding the received fifth frequency error e5 and a delayed fifth frequency error e5_d. The second delay unit 366 generates the delayed fifth frequency error e5_d by receiving the fifth frequency error e5 and delaying the received fifth frequency error e5 for a predetermined time. The second filter 362 further includes an amplification unit 364 that receives the third frequency error e3, multiplies the received third frequency error e3 by a predetermined gain value Ki, and outputs the result of the multiplication.

The DAC 370 receives the accumulated frequency error e_acc output from the loop filter 360, converts the received accumulated frequency error e_acc to an analog signal, and outputs a converted analog signal. The voltage control oscillator 380 generates a signal having a frequency proportional to a voltage level of an analog signal output from the DAC 370. The ADC 310 converts a received RF signal to a digital signal and outputs the digital signal, in response to an output signal of the voltage control oscillator 380. The PLL 300 performs a locking operation according to the above-described process.

Figure 7A:
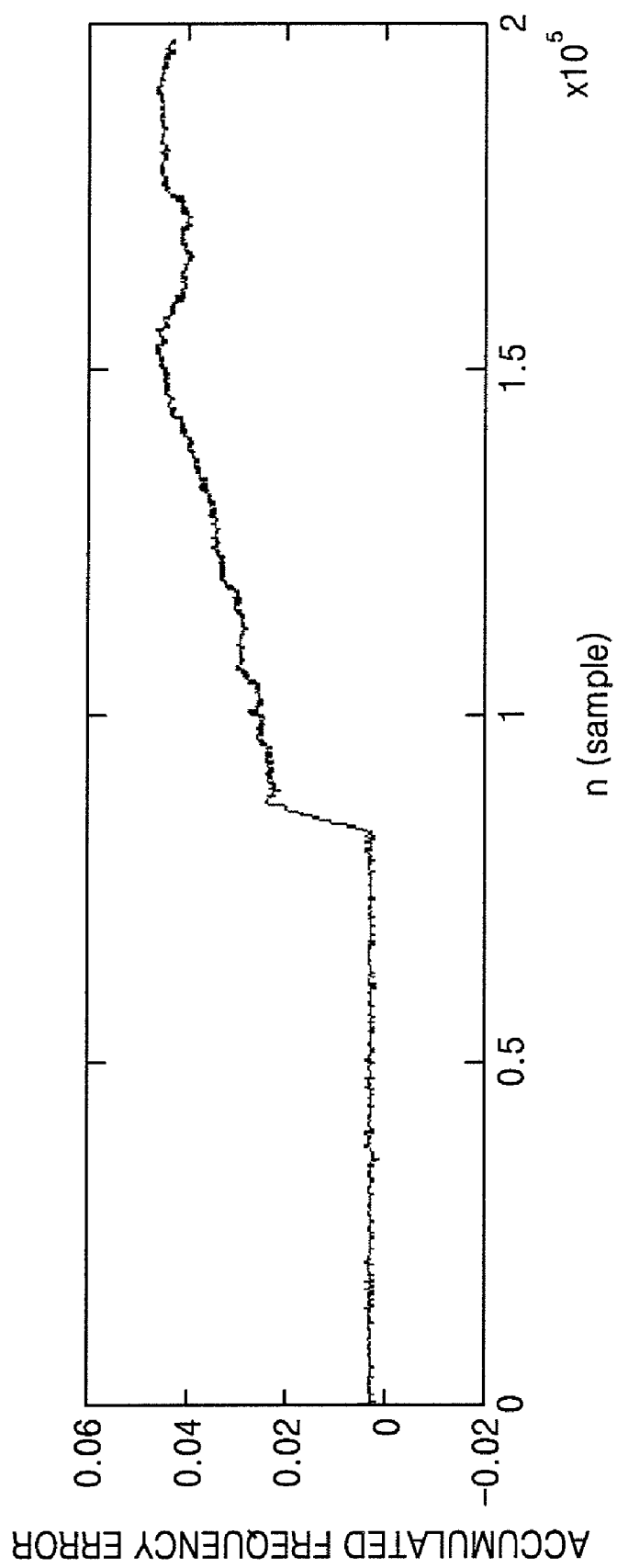
FIG. 7a is a graph showing a simulation result of the operation of a loop filter of a typical PLL.
Figure 7B:
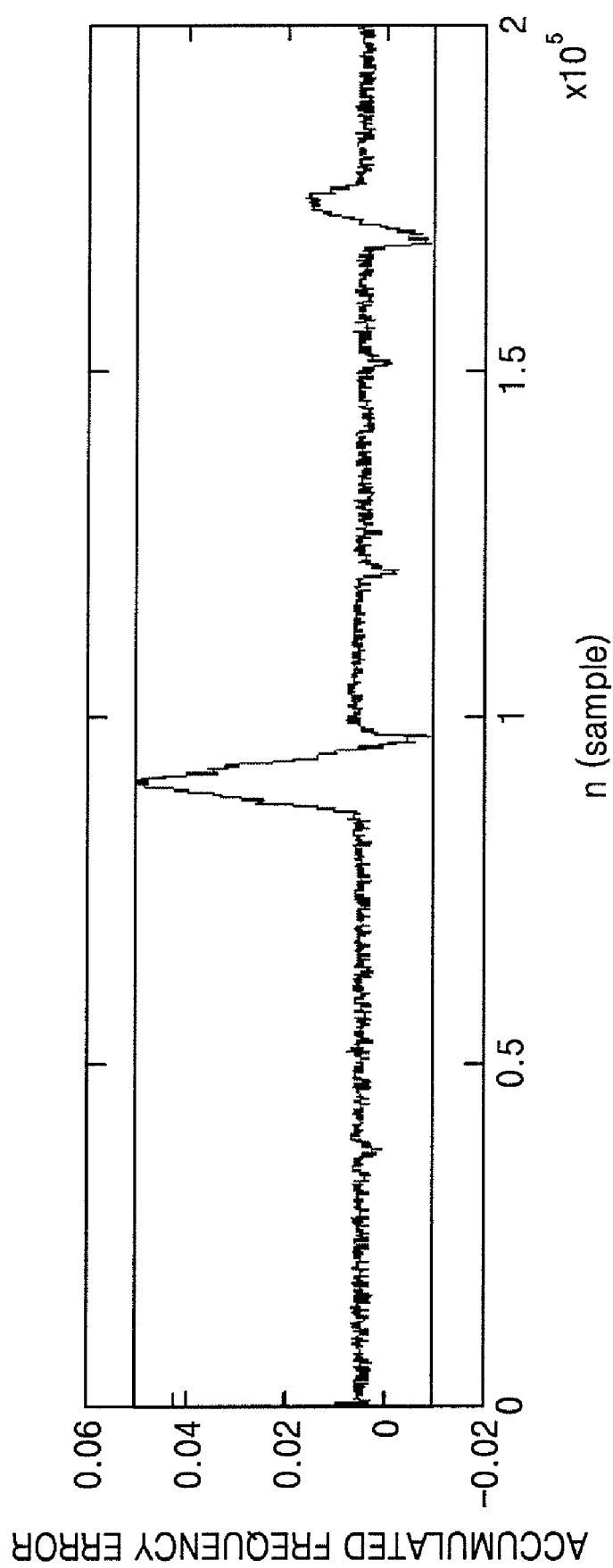
FIG. 7b is a graph showing a simulation result of the operation of a loop filter of a PLL according to an exemplary embodiment of the present invention.

FIG. 7a is a graph showing a simulation result of the operation of a loop filter of a typical PLL. FIG. 7b is a graph showing a simulation result of the operation of the loop filter 360 of the PLL 300 according to an exemplary embodiment of the present invention. Referring to FIG. 7a, it can be seen that, when a frequency error is abruptly changed in the typical PLL, the accumulated frequency error of a loop filter gradually increases. As a result, the typical PLL may not precisely perform a locking operation.

Referring to FIG. 7b, in the PLL 300 according to the present exemplary embodiment, even when the frequency error abruptly changes, the accumulated frequency error of the PLL 300 decreases and thus is maintained constant, which indicates that the PLL 300 is returned to a locking state. Thus, the PLL 300 has a range of performing a locking operation wider than that of the typical PLL.

Figure 8A:
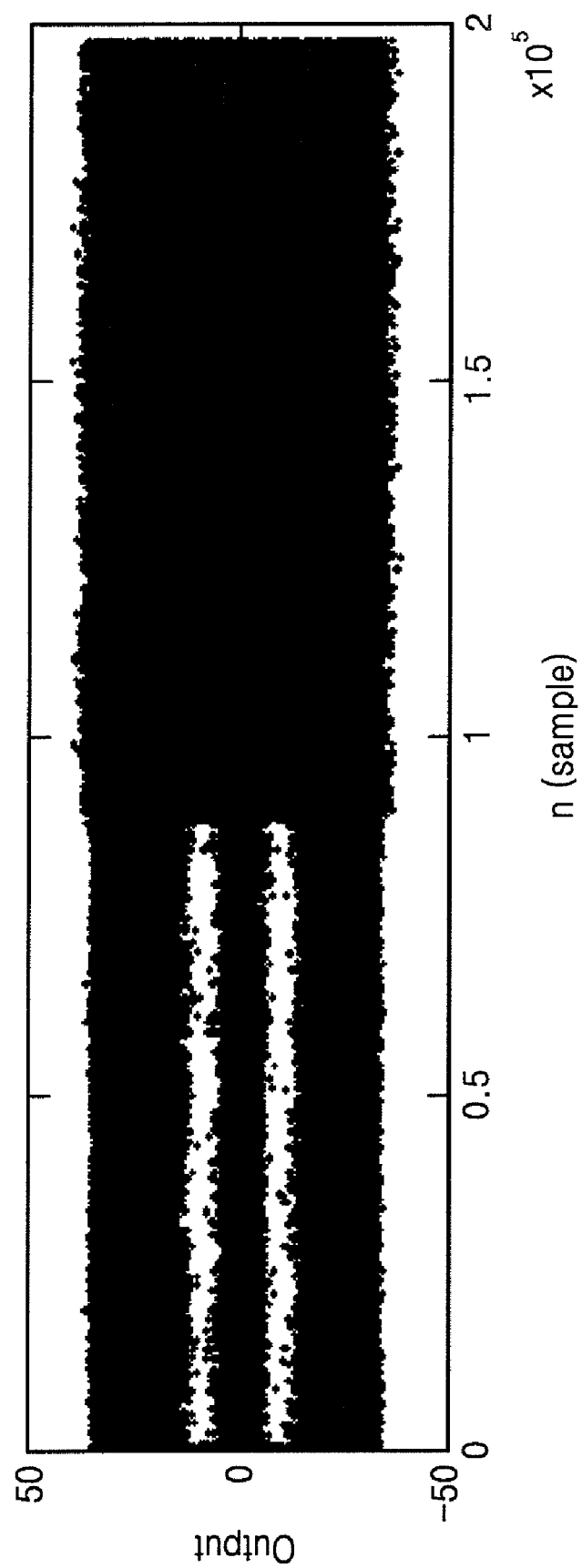
FIG. 8a is a graph showing the constellation of partial response signals of a PRML equalizer when an output signal of a typical PLL is applied to the PRML equalizer of a DVD read channel.
Figure 8B:
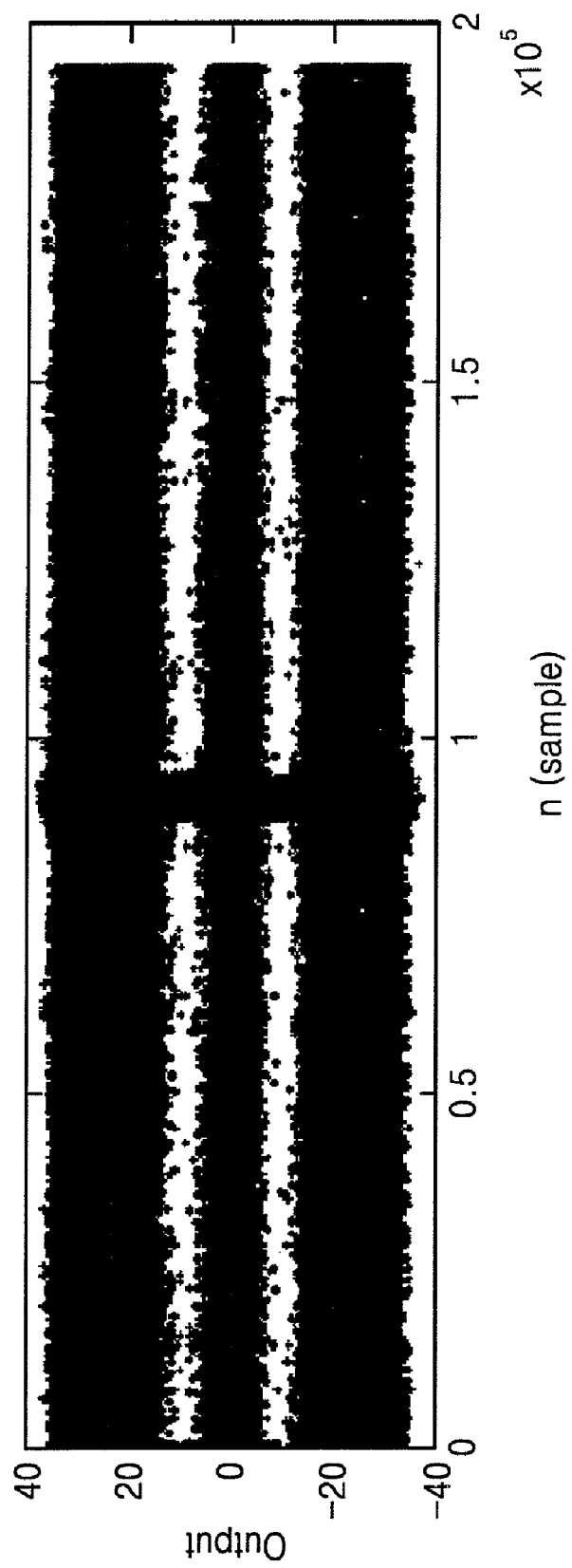
FIG. 8b is a graph showing the constellation of partial response signals of a PRML equalizer when an output signal of a PLL according to an exemplary embodiment of the present invention is applied to the PRML equalizer of a DVD read channel.

FIG. 8a is a graph showing the constellation of partial response signals of a PRML equalizer when an output signal of a typical PLL is applied to the PRML equalizer of a DVD read channel. FIG. 8b is a graph showing the constellation of partial response signals of a PRML equalizer when an output signal of a PLL according to an exemplary embodiment of the present invention is applied to the PRML equalizer of a DVD read channel. Referring to FIGS. 8a and 8b, when the frequency error abruptly changes, the PRML malfunctions when the output signal of the typical PLL is applied to the PRML. When the output signal of the PLL 300 is applied to the PRML, the PRML performs a normal operation.

FIG. 9 is a flowchart showing the operation of the FD2 330 of FIG. 6. Referring to FIGS. 6 and 9, the operation of the FD2 330 is described in further detail. First, the error measurement unit 400 measures the time interval between the zero-crossing points of a modulated input signal (S101). The sampling unit 410 generates the first and second absolute values respectively corresponding to the input signal and the delayed input signal at sampling time points before and after the l-th zero-crossing points where "l" is a natural number over 2.

The first linear interpolation unit 420 generates the first interpolation value $t_2^p$ or $t_2^n$ based upon the first and second absolute values. The zero-crossing point detection unit 430 detects the zero-crossing point of each of the input signal and the delayed input signal and measures the number of samplings $k^p$ or $k^n$ between the j-th zero-crossing point and the i-th zero-crossing point. The second linear interpolation unit 440 generates the interpolation value difference $t_2^p - t_1^p$ or $t_2^n - t_1^n$ based upon the first interpolation value $t_2^p$ or $t_2^n$ and the second interpolation value $t_1^p$ or $t_1^n$ generated at the i-th zero-crossing point and, and the measured time interval $\tau$ based upon the measured sampling number $k^p$ or $k^n$ and the interpolation value difference $t_2^p - t_1^p$ or $t_2^n - t_1^n$.

The error conversion unit 500 quantizes the measured time interval $\tau$ to one of the modulation time intervals (S102). For example, the measured time interval may be quantized using the closest sustaining time of the sustaining time 3T-11T of the data pulse of the EFM+ signal.

The error calculation unit 600 calculates the frequency error $e_{FD}'$ based upon the measured time interval $\tau$ and the difference $\tilde{\tau}$ between the quantized time intervals (S103). The error calculation unit 600 includes a fourth adder that subtracts the quantized time interval $\hat{\tau}$ from the measured time interval $\tau$.

The error generation control unit 700 controls whether to output the frequency error $e_{FD}'$ based upon the quantized time interval $\hat{\tau}$, the calculated frequency error $e_{FD}'$, and the predetermined critical value $\epsilon$ (S104). The error generation control unit 700 outputs the calculated frequency error $e_{FD}'$ only when quantized time interval $\hat{\tau}$ is within the predetermined time interval range between Tmin through Tmax and when the calculated frequency error $e_{FD}'$ is less than the predetermined critical value $\epsilon$.

The FD2 330 outputs the frequency error $e_{FD}$ obtained by multiplying the calculated frequency error $e_{FD}'$ by the predetermined gain value $K_{FD}$. In FIGS. 1-9, although the operation of the FD2 330 is described in an exemplary embodiment of the PLL 300 of a digitally controlled oscillator (DCO) type including the DAC 370 and the VCO 380 in a loop, the exemplary embodiment is not limited thereto. For example, the FD2 330 may be used for a numerically controlled oscillator (NCO) type PLL.

Figure 10:
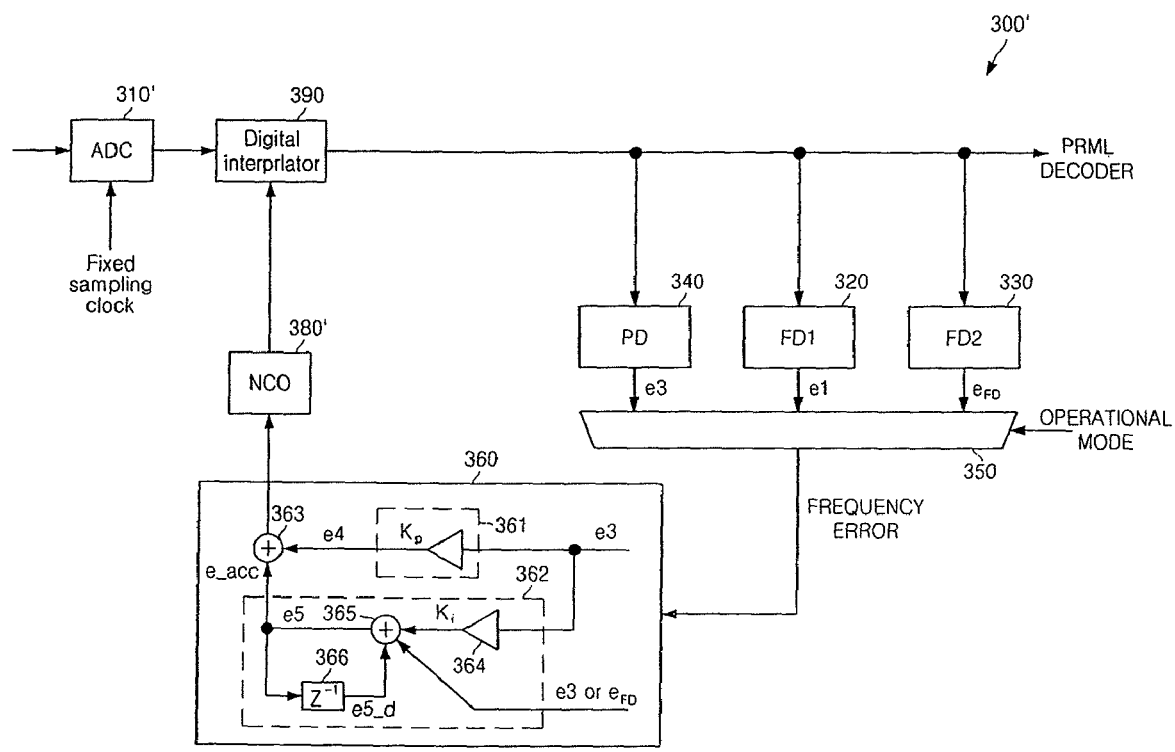
FIG. 10 is a block diagram of a PLL according to another exemplary embodiment of the present invention.

FIG. 10 is a block diagram of a PLL 300' according to another exemplary embodiment of the present invention. In FIGS. 3 and 10, since the structures and functions of the constituent elements having the same reference numerals, detailed descriptions thereof will be omitted herein. The difference between the PLL 300 of FIG. 3 and the PLL 300' of FIG. 10 will be mainly discussed herein.

The PLL 300' of FIG. 10 includes an ADC 310' that converts an input signal to a digital signal using a fixed sampling clock having a frequency higher than the maximum bit rate of the input signal, unlike the DAC 310 of FIG. 9. The digital signal converted by the DAC 310' may be sampled again by an NCO 380' and a digital interpolator 390 driven based upon the accumulated frequency error e_acc output from the loop filter 360.

As described above, according to at least one exemplary embodiment of the present invention, the frequency detector may continuously detect a frequency and the PLL including the frequency detector may have a wider frequency tracing range compared to a typical PLL. The PLL may be used in a signal processing device processing an EFM signal or EFM+ signal While exemplary embodiments have been particularly shown and described, it will be understood that various changes in form and details may be made therein without departing from the spirit and scope of the following claims.

What is claimed is:

1. A frequency detector comprising:
an error measurement unit that measures a time interval between zero-crossing points of an input signal that is modulated to provide a measured time interval;
an error conversion unit that quantizes the measured time interval using one of modulation time intervals to provide a quantized time interval; and
an error calculation unit that calculates a frequency error based upon a difference between the measured time interval and the quantized time interval to provide a calculated frequency error,
wherein the error measurement unit comprises:
a sampling unit that generates a first absolute value and a second absolute value respectively corresponding to the input signal and a delayed input signal at the sampling time points before and after a j-th zero-crossing point, where "j" is a natural number over 2;
a first linear interpolation unit that generates a first interpolation value based upon the first absolute value and the second absolute value;
a zero-crossing point detection unit that detects a zero-crossing point of each of the input signal and the delayed input signal and that measures the number of samplings between the j-th zero-crossing point and i-th zero-crossing point, "i" being a natural number greater than j, to provide a measured sampling number; and
a second linear interpolation unit that generates an interpolation value difference based upon the first interpolation value and a second interpolation value generated at the i-th zero-crossing point, and that generates the measured time interval based upon the measured sampling number and the interpolation value difference.

2. The frequency detector of claim 1, further comprising an error generation control unit that controls whether to output the frequency error based upon the quantized time interval, the calculated frequency error, and a predetermined critical value.

3. The frequency detector of claim 1, wherein the measured time interval is expressed by an equation:

$$\tau = k + \frac{|x_n|}{|x_n|+|x_{n+1}|} - \frac{|x_m|}{|x_m|+|x_{m+1}|},$$

wherein "$\tau$" is the measured time interval, k is a number of samplings between a j-th zero-crossing point, where "j" is a natural number over 2, and an i-th zero-crossing point, where "i" being a natural number greater than j, $x_n$ and $x_{n+1}$ are values of input signals sampled before and after the j-th zero-crossing point, and $x_m$ and $x_{m+1}$ are values of input signals sampled before and after the i-th zero-crossing point.

4. The frequency detector of claim 1, wherein "j" is a natural number next to "i".

5. The frequency detector of claim 1, wherein the sampling unit comprises:
a delay unit that receives the input signal, delays the received input signal for a predetermined time, and outputs the delayed input signal; and
an absolute value generation unit that generates the first absolute value and the second absolute value based upon values obtained by sampling the input signal and the delayed input signal at a predetermined time interval.

6. The frequency detector of claim 1, wherein the first linear interpolation unit comprises:
a first adder that receives the first absolute value and the second absolute value, sums the received first absolute value and second absolute value, and outputs a third absolute value;
a look-up table that receives the third absolute value and generates a reciprocal of the received third absolute value; and
a first multiplier that receives the second absolute value and the reciprocal of the third absolute value and generates the first interpolation value by multiplying the second absolute value and the reciprocal of the third absolute value.

7. The frequency detector of claim 1, wherein the zero-crossing point detection unit comprises:

a zero-crossing point detector that detects a zero-crossing point of each of the input signal and the delayed input signal; and
a counter that generates the measured sampling number by counting the number of samplings from the j-th zero-crossing point generation point in time to the i-th zero-crossing point generation point in time.

8. The frequency detector of claim 1, wherein the second linear interpolation unit comprises:
a register that receives and stores the first interpolation value in response to a generation of the j-th zero-crossing point, and outputs the second interpolation value;
a second adder that receives the first interpolation value and the second interpolation value and generates the interpolation value difference based upon the first interpolation value and the second interpolation value; and
a third adder that receives the interpolation value difference and the measured sampling number, sums the interpolation value difference and the measured sampling number, and generates the measured time interval.

9. The frequency detector of claim 1, wherein the error measurement unit further comprises a first selector that selectively outputs the measured time interval at a positive zero-crossing point or the measured time interval at a negative zero-crossing point.

10. The frequency detector of claim 1, wherein the error conversion unit quantizes the measured time interval using the closest time interval of the modulation time intervals.

11. The frequency detector of claim 1, wherein the frequency error is expressed by an equation:

$$e_{FD} = \begin{cases} K_{FD}(\tau - \hat{\tau}), & \text{if } (|\tau - \hat{\tau}| < \varepsilon) \text{ and } T_{min} \leq \hat{\tau} \leq T_{max} \\ 0, & \text{otherwise} \end{cases},$$

where "$e_{FD}$" is the frequency error, "$K_{FD}$" is a gain value of the frequency detector, "$\tau$" is the time interval between the zero-crossing points, "$\hat{\tau}$" is the time interval between the quantized zero-crossing points, "$\varepsilon$" is a critical value of the frequency error $e_{FD}$, "$T_{min}$" is the minimum value of the quantized time interval "$\hat{\tau}$", and "$T_{max}$" is the maximum value of the quantized time interval "$\hat{\tau}$".

12. The frequency detector of claim 2, wherein the error generation control unit comprises:
a first error generation control unit that generates a first control signal based upon whether the quantized time interval is within a predetermined time interval range;
a second error generation control unit that generates a second control signal based upon a result of a comparison between the calculated frequency error and the predetermined critical value; and
an error generation determination unit that controls whether to output the frequency error in response to the first control signal and the second control signal.

13. The frequency detector of claim 12, wherein the error generation control unit further comprises a sign detection unit that receives the frequency error and outputs only a sign value indicating a direction of the frequency error to the error generation determination unit.

14. The frequency detector of claim 2, further comprising an amplification unit that multiplies the frequency error output from the error generation control unit by a predetermined gain value and outputs a multiplied frequency error.

15. A phase locked loop comprising:
a first frequency detector that detects and outputs a first frequency error based upon a sync pulse of an input signal that is modulated in a first operational mode from a point in time when a supply of power starts to a point in time when a frequency of the input signal approaches a first frequency;
a second frequency detector that detects and outputs a second frequency error based upon a data pulse of the input signal in a second operational mode from the point in time when the frequency of the input signal approaches the first frequency to a point in time when the frequency of the input signal approaches a second frequency;
a phase detector that detects and outputs a third frequency error in the second operational mode and in a third operational mode from the point in time when the frequency of the input signal approaches the second frequency to a point in time when the frequency of the input signal approaches a locking frequency; and
a loop filter that generates an accumulated frequency error in proportion to one of the first frequency error, the second frequency error, or the third frequency error that is received based upon the operational mode,
wherein a locking operation with respect to the data signal is performed based upon the accumulated frequency error.

16. The phase locked loop of claim 15, further comprising a frequency error selection unit that selectively outputs a corresponding one of the first frequency error, the second frequency error, or the third frequency error based upon the operational mode to the loop filter.

17. The phase locked loop of claim 16, wherein the second frequency detector further comprises:
an error measurement unit that measures a time interval between zero-crossing points of the input signal to provide a measured time interval;
an error conversion unit that quantizes the measured time interval using one of modulation time intervals to provide a quantized time interval;
an error calculation unit that calculates a frequency error based upon a difference between the measured time interval and the quantized time interval to provide a calculated frequency error; and
an error generation control unit that controls whether to output the second frequency error based upon the quantized time interval, the calculated frequency error, and a predetermined critical value.

18. The phase locked loop of claim 15, wherein the loop filter is a second loop that comprises:
a first filter that outputs a fourth frequency error in proportion to the third frequency error;
a second filter that receives a corresponding one of the first frequency error, the second frequency error, or the third frequency error based upon the operational mode and outputs a fifth frequency error accumulated in proportion to the received frequency error; and
a first adder that generates the accumulated frequency error by receiving and summing the fourth frequency error and the fifth frequency error.

19. The phase locked loop of claim 18, wherein the second filter comprises:
a second adder that receives and sums the received frequency error and a delayed fifth frequency error to generate the fifth frequency error; and
a delay unit that generates the delayed fifth frequency error by receiving the fifth frequency error, delaying the received fifth frequency error for a predetermined time, and outputting the delayed fifth frequency error.

20. A signal processing device comprising:
a first frequency detector that detects and outputs a first frequency error based upon a sync pulse of an input signal that is modulated in a first operational mode from a point in time when a supply of power starts to a point in time when a frequency of the input signal approaches a first frequency;
a second frequency detector that detects and outputs a second frequency error based upon a data pulse of the input signal in a second operational mode from the point in time when the frequency of the input signal approaches the first frequency to a point in time when the frequency of the input signal approaches a second frequency;
a phase detector that detects and outputs a third frequency error in the second operational mode and in a third operational mode from the point in time when the frequency of the input signal approaches the second frequency to a point in time when the frequency of the input signal approaches a locking frequency;
a loop filter that generates an accumulated frequency error in proportion to one of the first frequency error, the second frequency error, or the third frequency error that is received based upon the operational mode, and
a frequency error selection unit that selectively outputs a corresponding one of the first frequency error, the second frequency error, or the third frequency error based upon the operational mode to the loop filter,
wherein a locking operation with respect to the data signal is performed based upon the accumulated frequency error, and
wherein the input signal is an eight-to-fourteen modulation format (EFM) signal or an EFM+ signal.

* * * * *